United States Patent [19]

Yasuno et al.

[11] Patent Number: 4,883,575
[45] Date of Patent: Nov. 28, 1989

[54] APPARATUS FOR CONTINUOUSLY PRODUCING A BASE FOR A PRINTED CIRCUIT BOARD

[75] Inventors: Hiroshi Yasuno; Fumio Sakatani, both of Ichihara; Takeshi Kanda, Ayase, all of Japan

[73] Assignees: UBE Industries Ltd., Yamaguchi; Meiko Electronics Company, Ltd., Kanagawa, both of Japan

[21] Appl. No.: 201,912

[22] Filed: Jun. 2, 1988

[30] Foreign Application Priority Data

Jun. 5, 1987 [JP] Japan .................................. 62-141142

[51] Int. Cl.[4] .............................................. C25D 17/00
[52] U.S. Cl. ....................................... 204/198; 204/203
[58] Field of Search ................................. 204/198, 203

[56] References Cited

U.S. PATENT DOCUMENTS 2,738,321  3/1956  Finston .................................. 204/203
2,979,181  4/1961  Abbey .................................... 204/198

FOREIGN PATENT DOCUMENTS 55-36198  9/1980  Japan .

Primary Examiner—T. M. Tufariello
Attorney, Agent, or Firm—Burgess, Ryan & Wayne

[57] ABSTRACT

A base for a printed circuit board is continuously produced by an apparatus comprising at least one degreasing vessel, at least one water pre-washing vessel, at least one electrodeposition coating vessel, at least one electrodepositing liquid-recovering vessel, at least one water post-washing vessel, and a transporting device for intermittently transporting the base successively through the above-mentioned vessels, which apparatus is provided with a device for conveying the base to a predetermined position above one of the above-mentioned vessels, stopping the base at that position, introducing the base into the vessel, keeping the base in the vessel for a predetermined time, and withdrawing the base from the vessel.

22 Claims, 14 Drawing Sheets

APPARATUS FOR CONTINUOUSLY PRODUCING A BASE FOR A PRINTED CIRCUIT BOARD

BACKGROUND OF THE INVENTION

1. Field of the Invention

The present invention relates to an apparatus for continuously producing a base for a printed circuit board. More particularly, the present invention relates to an apparatus for continuously producing a base for a printed circuit board by utilizing an electrodeposition coating technology before formation of an etching resist layer in a predetermined pattern.

The above-mentioned etching resist coating layer-forming method is advantageous in that the formation of the etching resist coating layer is much easier than conventional etching resist coating layer-forming methods, for example, a hole-plug method, tenting method and solder-stripping method.

2. Description of the Related Art

In a process for producing a base for a printed circuit board, recently a method for forming an etching resist coating layer on the base has been provided. In this method, an insulating resist coating layer is formed in a negative pattern corresponding to a desired positive pattern on portions of the base surface, and then the remaining portions of the base surface, which portions are free from the insulating resist coating, are coated with an etching resist by an electrodeposition coating method.

In the above-mentioned process, the base should be degreased and pre-washed with water before the etching resist coating layer-forming procedures. Also, after the etching resist coating layer-forming procedures are completed, the base should be washed with water.

The above-mentioned etching resist coating layer-forming method is advantageous in that the formation of the etching resist coating layer is much easier than conventional methods, for example, a hole-plug method, tenting method and solder-stripping method.

Nevertheless, apparatuses which enable the procedures before and after the etching resist coating layer-forming procedures to be continuously carried out, are not known.

SUMMARY OF THE INVENTION

An object of the present invention is to provide an apparatus for continuously producing a base for a printed circuit board, which apparatus enables procedures before and after etching resist coating layer-forming procedures to be continuously carried out with a high efficiency.

The above-mentioned object can be attained by the apparatus of the present invention, which comprises:

(A) a degreasing zone for degreasing a base for a printed circuit board, comprising at least one vessel containing a degreasing liquid;

(B) a water pre-washing zone for pre-washing the degreased base with water, comprising at least one water pre-washing vessel and located downstream from the degreasing zone;

(C) an electrodeposition coating zone for treating the pre-washed base with an electrodepositing liquid, comprising at least one vessel containing the electrodepositing liquid and located downstream from the water pre-washing zone;

(D) a zone for recovering the electrodepositing liquid remained on the electrodeposition coated base, comprising at least one filtrate vessel connected to the electrodepositing vessel to form a closed channel, and located downstream from the electrodeposition coating zone;

(E) a water post-washing zone for washing the base delivered from the recovering zone, comprising at least one water post-washing vessel and located downstream from the recovering zone; and (F) a transporting device for intermittently transporting the base successively through the above-mentioned degreasing, water pre-washing, electrodeposition coating, filtrate and water post-washing vessels, which transporting device is provided with means for conveying the base to a predetermined position above each of the vessel, stopping the base when it reaches the position, introducing the base into each vessel, keeping the base in the vessel for a predetermined time and withdrawing the base from the vessel.

DESCRIPTION OF THE PREFERRED EMBODIMENTS

Embodiments of the apparatus of the present invention for producing a base for a printed circuit board will be explained with reference to FIGS. 1 to 14 of the attached drawings below.

Figure 1:
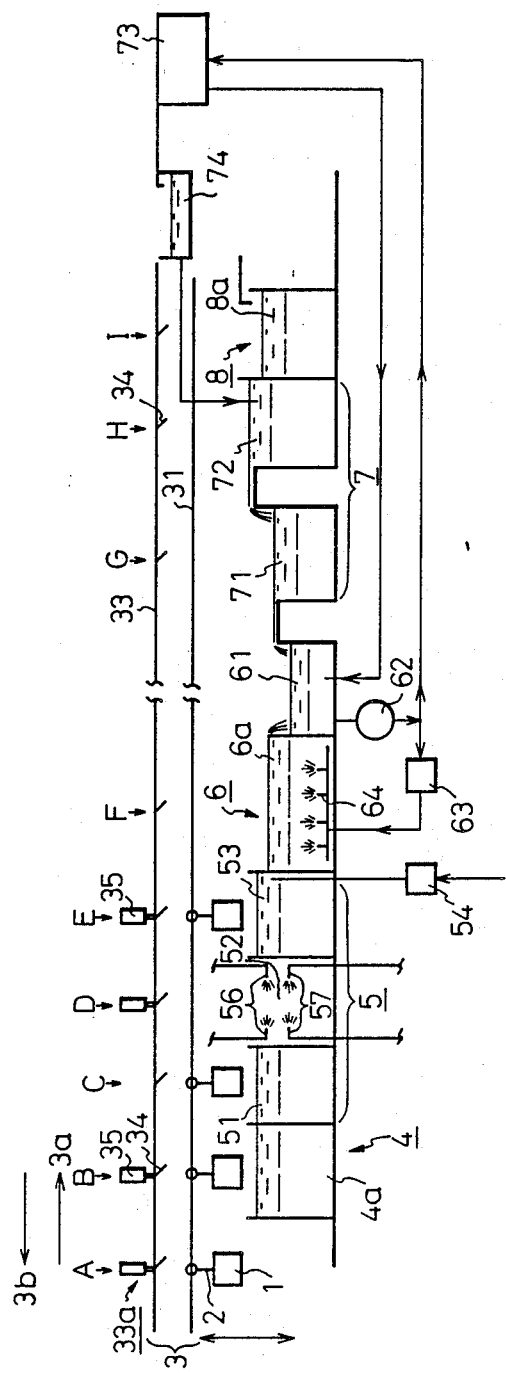
FIG. 1 shows an outline of arrangement of elements in an embodiment of the apparatus of the present invention.
Figure 2:
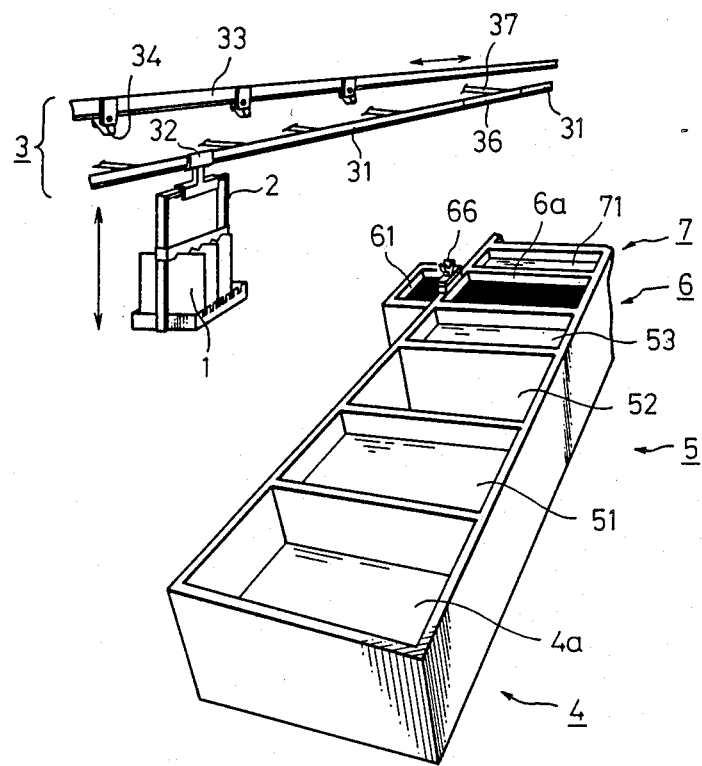
FIG. 2 is a schematic partial view of the apparatus shown in FIG. 1.

FIG. 1 shows an arrangement of elements in an embodiment of the apparatus of the present invention and FIG. 2 is a schematic view of a portion of the apparatus shown in FIG. 1.

Referring to FIGS. 1 and 2, a plurality of bases 1, having an insulating resist coating layer formed on each base in a predetermined negative pattern, are held by a plurality of racks 2, which are spaced from each other and capable of holding the bases and of being connected to a current source, and are transported by a transporting device 3 along a predetermined path. In FIG. 1, the racks are conveyed from left to the right.

In the apparatus shown in FIG. 1, a degreasing zone 4, a water pre-washing zone 5, an electrodeposition coating zone 6, an electrodepositing liquid-recovering zone 7, which forms a closed channel together with the electrodeposition coating zone 6, and a water post-washing zone 8, are arranged below the transporting device 3, in that order along the direction of movement of the bases 1.

In the embodiment indicated in FIG. 1, the degreasing zone 4 comprises a single degreasing vessel 4a containing a degreasing liquid, and the water pre-washing zone 5 comprises a first water pre-washing vessel 51 containing an ordinary washing water, for example, well water or city water, a second water pre-washing vessel 52 in which an ordinary washing water or deionized water (pure water) is sprayed toward the bases, and a third water pre-washing vessel 53 containing deionized water, arranged in that order. The electrodeposition coating zone 6 comprises a single electrodeposition coating vessel 6a with an overflow vessel 61 which will be explained hereinafter. Also, the electrodepositing liquid-recovering zone 7 comprises a first filtrate vessel 71 and a second filtrate vessel 72, arranged in that order. Further, the water post-washing zone 8 comprises a single water post-washing vessel 8a.

In the degreasing vessel 4a, the bases 1 are degreased by the degreasing liquid and the degreased bases are easily defoamed.

The degreasing vessel 4a is preferably provided with a means for maintaining the degreasing liquid contained therein at a constant level, while continuously supplying a fresh degreasing liquid therein and continuously discharging a waste degreasing liquid therefrom.

In the water pre-washing zone 5, the first water pre-washing vessel 51 removes remaining degreasing liquid on the base surfaces and is provided with a means for maintaining the washing water wherein at a constant level while continuously supplying fresh washing water therein and continuously discharging waste washing water therefrom. The second water pre-washing vessel 52 is provided with a pair of spray devices 56 and another pair of spray devices 57 for pre-washing the bases with an ordinary washing water or deionized water. The spray devices 56 are located at upper portions of the inside space of the vessel 52 and spray deionized water toward the bases, and the spray devices 57 are located at lower portions of the inside space of the vessel 52 and spray an ordinary washing water toward the bases, to completely remove remaining degreasing liquid from the base surfaces. The deionized water sprayed to the bases effectively removes ionic substances from the base surfaces and decreases a load at the third water prewashing vessel, in which the bases are further washed with deionized water.

The second water pre-washing vessel 52 is preferably provided with both of the spray devices 56 and 57, but the vessel 52 may be provided with only one of the spray devices 56 and 57. In each of the spray devices 56 and 57, the directions of the sprayed water streams are not limited to a specific direction, and preferably, the washing water is sprayed so that the sprayed water flows along the surfaces of the bases.

In the third water pre-washing vessel 53, the bases are further washed with deionized water to prevent an undesirable contamination of the electrodepositing liquid in the electrodeposition coating zone 6 with ions carried by the bases. This washing with ionized water also effectively prevents an undesirable change in the composition of the electrodepositing liquid by the ions carried therein by the bases, and thus avoid the production of defective products.

The third water pre-washing vessel 53 is preferably equipped with an ion-exchange device (a pure water-producing device) 54 for continuously correcting an ordinary water to deionized water and for feeding the deionized water to the third vessel 53. Also, the third vessel 53 is preferably equipped with a means for maintaining the ionized water therein at a constant level while continuously supplying the ionized water therein and discharging the waste ionized water therefrom.

Preferably, the ion-exchange device 54 is also connected to the spray device 56, to feed a portion of the deionized water to the spray device 56.

If necessary, the third vessel 53 is provided with a means for removing water from the bases when the bases are withdrawn from the third vessel 53 and conveyed to the electrodeposition coating zone 6, for example, an air knife (not shown in FIGS. 1 and 2) can be arranged above the third vessel 53. This water-removing means effectively prevents an undesirable change in the composition or concentration of the electrodepositing liquid.

When the water is removed from the base surfaces by the air knife, etc., preferably the water is removed to an extent such that the surfaces of the bases are kept in a wetted condition with deionized water, or such that, when the bases are to be used for throughhole printed circuit boards, the deionized water contained in the throughholes in the bases is retained. If too much water is removed, undesirable bubbles are easily generated on the base surfaces immersed in the electrodepositing liquid, and thus the resultant products are defective.

Preferably, the electrodeposition coating vessel 6a is provided with at least one jacket (not shown in FIGS. 1 and 2) formed in the peripheral walls and bottoms of the vessel 6a and connected to a water supply source. The jacket may contain therewithin a heater (not shown in FIGS. 1 and 2). The water jacket and heater effectively control the temperature of the electrodepositing liquid in the vessel 6a to a desired level. That is, the water jacket with the heater serve as a constant temperature bath for the electrodepositing liquid in the vessel 6a.

Also, the electrodeposition coating vessel 6a is preferably provided with an insulating net (not shown in FIGS. 1 and 2) which can prevent undesirable direct contact of the bases with the inside surface of the vessel 6a, even if the bases fall out of the racks 2 and drop into the vessel 6a. Note, the inside surface of the vessel 6a serves as an electrode having an opposite polarity to that of an electrode 66 shown in FIG. 2 and located above the vessel 6a.

The electrodeposition coating vessel 6a is attached with an overflow vessel 61 which receives an overflow of the electrodepositing liquid from the vessel 6a.

The overflow vessel 61 is connected to the electrodeposition coating vessel 6a through a pump 62 and a strainer (filtration device) 63. A portion of the electrodepositing liquid is circulated from the overflow vessel 61 to the electrodeposition coating vessel 6a through the pump 62 and the strainer 63. The circulated electrodepositing liquid is spouted into the vessel 6a, for example, through a plurality of nozzles 64 to agitate the liquid so as to prevent an undesirable deposition of coating material in the liquid and to uniformly disperse the coating material in the liquid.

In FIG. 1, the overflow vessel 61 is indicated as being located between the electrodeposition coating vessel 6a and the electrodepositing liquid-recovering zone 7, but, as shown in FIG. 2 the overflow vessel 61 should be arranged in parallel to the electrodeposition coating vessel 6a so that the electrodeposition coating vessel 6a is directly connected to the electrodepositing liquid-recovering zone 7.

The bases 1 held by the racks 2 are not brought into the overflow vessel 61.

The electrodeposition coating vessel 6a is preferably provided with a means for continuously feeding a fresh electrodepositing liquid therein, in addition to the electrodepositing liquid-circulating means including the overflow vessel 61, the pump 62, the strainer 63, and the spouting nozzles 64.

The electrodepositing liquid-recovering zone 7 functions to recover the electrodepositing liquid carried by the bases from the electrodeposition coating zone 6 and serves as a pre-washing zone for the electrodeposition coated bases prior to the water post-washing zone.

The recovering zone 7 indicated in FIG. 1 comprises a first filtrate vessel 71 and a second filtrate vessel 72.

Referring to FIG. 1, the bottom of the overflow vessel 61 is connected to an ultrafiltration device 73 through the pump 62 to withdraw a portion of the electrodepositing liquid from the overflow vessel 61 and to ultrafilter the withdrawn portion of the electrodepositing liquid. The resultant filtrate is fed into the second filtrate vessel 72 through a tank 74, and then into the first filtrate vessel 71. A portion of the filtrate in the first filtrate vessel 71 flows to the overflow vessel 61.

Also, an electrodeposition coating material separated from the filtrate by the ultrafiltration device 73 is directly returned into the overflow vessel 61. That is, the filtrate containing non-deposited coating material recovered from the bases, and the filtered coating material, are returned to the overflow vessel 61. Accordingly, the circulation of the electrodepositing liquid through the ultrafiltration device 73 in addition to the circulation of the electrodepositing liquid between the electrodeposition coating vessel 6a and the overflow vessel 61 through the pump 62 and the strainer 63 effectively maintains the concentration and composition of the electrodepositing liquid in the electrodeposition coating vessel 6a at a substantially constant level.

The water post-washing zone 8 is used to finally remove non-fixed electrodeposition coating material from the base surfaces, to prevent a production of defective products.

Referring to FIG. 1, the water post-washing zone 8 comprises a single water post-washing vessel 8a containing an ordinary washing water, for example, well water or city water.

The water post-washing vessel 8a is preferably provided with a means (not shown) for maintaining the washing water wherein at a constant level while continuously feeding fresh water therein and discharging waste washing water therefrom. Of course, the washing water may be deionized water.

Figure 3:
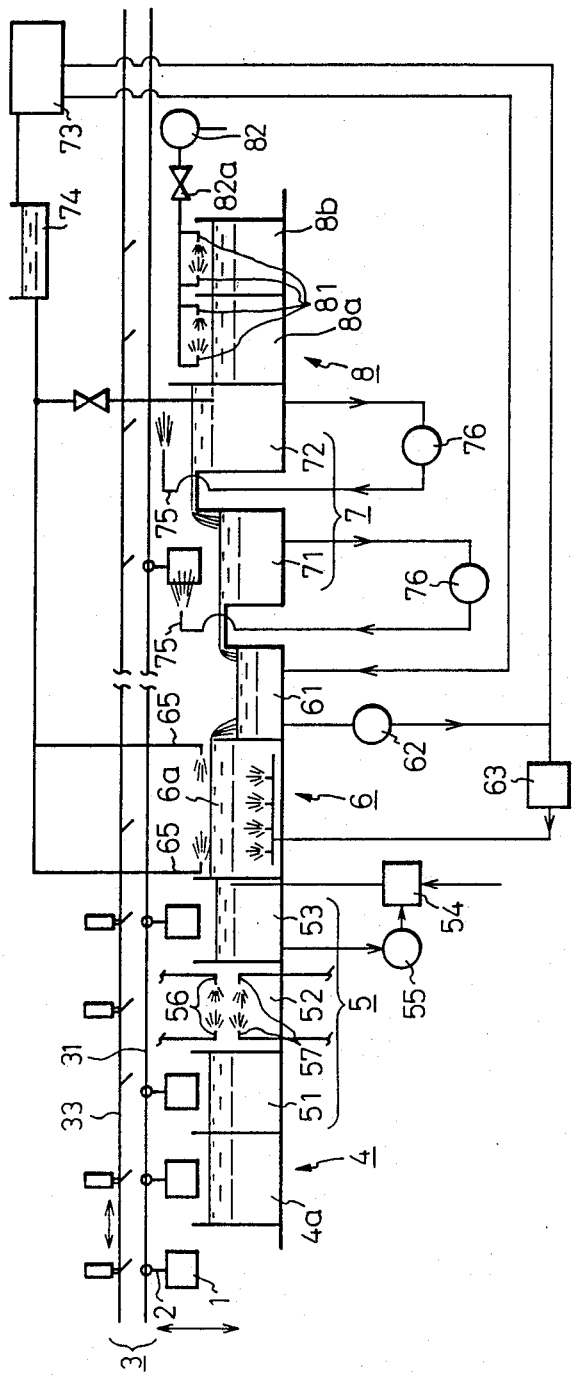
FIG. 3 shows an outline of an arrangement of elements in another embodiment of the apparatus of the present invention.

FIG. 3 is a schematic view of another embodiment of the apparatus of the present invention.

Referring to FIG. 3, in a water pre-washing zone 5, a third water pre-washing vessel 53 is provided with a pump 55 connected to the ion exchange device 54 so that a portion of the waste deionized water discharged from the third vessel 53 by the pump 55 is ion-exchanged by the ion-exchange device 54 and then circulated into the third vessel 53. This circulation system effectively reduces the ion-exchange load at the ion exchange device 54, to enable an easier control of the quality of the deionized water in the third vessel 53, and to reduce the amount of the fresh water to be supplied to the ion-exchange device 54 to a level substantially equal to the amount of the deionized water evaporated from the third vessel 53.

Referring to FIG. 3, the electrodeposition coating vessel 6a is equipped with a pair of spray devices 65 connected to the ultrafiltration device 73 through the tank 74. When the bases are withdrawn from the electrodeposition coating vessel 6a, they are washed with streams of the filtrate ejected through the spray devices 65, to remove unfixed electrodeposition coating material on the base surfaces and to directly recover the unfixed coating material into the electrodeposition coating vessel 6a. These spray devices 65 also effectively reduce the amount of unfixed coating material carried into the first and second filtrate vessels 71 and 72 by the bases, to decrease an undesirable contamination of the filtrate in the first and second vessels 71 and 72 with the unfixed coating material and to increase the effect of washing by the filtrate on the bases in the first and second vessels 71 and 72.

Each of the filtrate vessels 71 and 72 is preferably equipped with a spray device 75 located thereabove and connected thereto through a pump 76 to spray a portion of the filtrate toward the bases brought from the proceeding vessel 6a or 71 to above the filtrate vessel. The spray device 75 may be provided at either of the first and second filtrate vessels 71 and 72.

Referring to FIG. 3, the water post-washing zone 8 comprises a first water post washing vessel 8a and a second water post-washing vessel 8b. The first and second water post-washing vessels 8a and 8b are equipped with spray devices 81 located above the vessels 8a and 8b and connected to a washing water supply source (not shown in FIG. 3) through a valve 82a and a pump 82. The bases delivered from the electrodepositing liquid-recovery zone 7 are washed with ordinary washing water sprayed through the spray devices 81. The spray devices 81 effectively increase the washing effect of the water post-washing zone on the bases delivered from the electrodepositing liquid-recovering zone 7.

Where the water post-washing zone 8 comprises two or more water post-washing vessels, at least one of the vessels may be provided so that the washing water applied to the bases is directly discharged therefrom and does not remain therein in a large amount.

The washing water to be used for the water post-washing vessels may be deionized water.

At least one of the water washing vessel 51, 52, and 53 in the water pre-washing zone 5 is preferably provided with a vibrating device located above the level of the water in the vessel 51, 52 or 53. This vibrating device effectively vibrates the bases positioned above the vessel to remove remaining washing water from the bases.

Referring to FIGS. 1, 2 and 3, the transporting device 3 is used to intermittently transport the bases 1 successively through the above-mentioned degreasing zone 4, water pre-washing zone 5, electrodeposition coating zone 6, electrodepositing liquid-recovering zone 7 and water post-washing zone 8. The transporting device 3 is provided with means for conveying the bases to a predetermined position above each of the vessels, stopping the bases when they reach that position, introducing the bases into each vessel, keeping them in the vessel for a predetermined time, and withdrawing the bases from the vessel.

Referring to FIGS. 1 to 5, the transporting device 3 is provided with a first rail 31 extending above and along the degreasing, water pre-washing, electrodeposition coating, electrodepositing liquid-recovering, and water post-washing vessels arranged in a series, and a second rail 33 extending above, in parallel to, and spaced from the first rail 31.

The first rail 31 is vertically movable reversibly up and down in a predetermined distance and is provided with a plurality of holding members 32 which ride on the first rail 31 and are slidably-movable on and along the first rail 31. The racks 2 are held by and allowed to hang down from hooks 322 of the holding member 32.

The holding members 32 also have sliding saddles 321 and projections 323 extending upward from the sliding saddles.

The first rail 31 vertically moves reversibly up and down to introduce the bases 1 on the rack 2 into a vessel, and to withdraw the bases on the rack from the vessel.

Figure 4A:
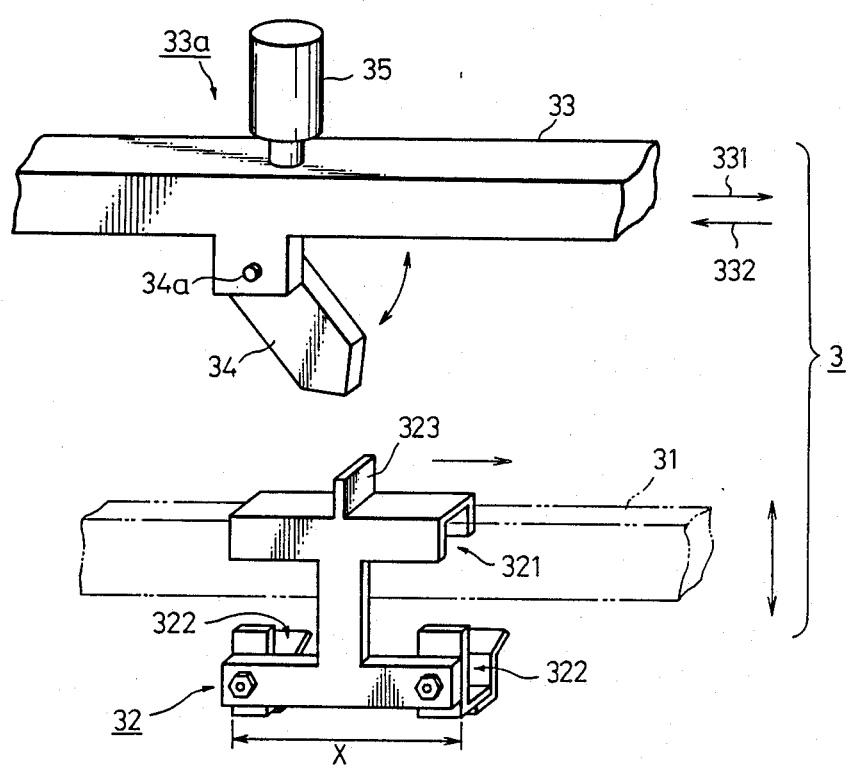
FIG. 4A is a schematic view of a means for horizontally moving a rack holding the bases and means for vertically moving the rack, to be joined with the horizontally moving means.

The second rail 33 is horizontally movable reversibly in two opposite directions over a predetermined distance along the transporting path of the bases and is provided with a plurality of means 33a for joining with the holding member 32. The joining means 33a comprises pawl 34 attached to projections 34a extending downward from the bottom of the second rail 33, as shown in FIG. 4A. The pawls 34 are capable of revolving around pivots 34a by means of air cylinders 35 in the directions shown by arrows in FIG. 4A.

Referring to FIG. 4A, when the first rail 31 is in an uppermost position thereof and the pawl 34 of the second rail 33 extends downward, the lower end portion of the pawl 34 comes into contact with the left side surface of the projection 323 of the holding member 32 on the first rail 31 to join the joining means 33a on the second rail 33 with the holding member 32 on the first rail 31. That is, when the second rail 33 moves horizontally in the direction shown by an arrow 331, the holding member 32 is joined with the joining means 33a on the second rail 33 through the pawl 34 and the projection 323, and slides on the first rail 31 in the direction 331. However, when the second rail 33 moves in the opposite direction shown by an arrow 332, the pawl 34 is released from the projection 323, and thus the holding member 32 is left in the present position. Also, when the first rail 31 moves downward, or the pawl 34 revolves upward, the pawl 34 is released from the projection 323.

Referring to FIG. 1, a plurality of the means 33a for horizontally moving the holding member 32 are arranged in positions A to I spaced at a predetermined distance on the second rail 33. The position A is located upstream of the degreasing zone 4, and the positions B to I correspond to the vessels 4a, 51, 52, 53, 6a, 71, 72, and 8a, respectively.

When the first rail 31 reaches an uppermost position thereof in each of the positions A to I, the holding member 32 of the first rail 31 can join with the joining means 33a of the second rail 33 through the projection 323 and the pawl 34.

When the second rail 33 moves in the direction shown by an arrow 3a in FIG. 1, the holding member 32 is pushed by the pawl 34 and slides on the first rail 31, for example, from position A to the next position B.

If the second rail 33 moves in the opposite direction shown by an arrow 3b in FIG. 1, the joining means 33a is released from the holding member 32, and the joining means 33a can return from the position B to the position A while leaving the holding means 32 at the position B.

If the pawl 34 is revolved upward, the joining means 33a cannot join the holding member 32 even when the first rail 31 comes to the uppermost position, and thus the second rail 33 can move independently from the first rail 31.

As mentioned above, the joint of the joining means 33a of the second rail 33 with the holding member 32 of the first rail 31 can be formed or released by vertically moving the first rail 33 up or down, by horizontally moving the second rail 31 in one direction or in an opposite direction, and by revolving the pawl 34 upward or downward around the pivot 34a by using the air cylinder 35. Also, the bases contained in the rack 2 held by the holding member 32 can be intermittently transported along a predetermined transporting path, introduced into a vessel, kept in the vessel for a predetermined time and withdrawn from the vessel by reversibly moving the first and second rails 31 and 33, each in two opposite directions, at predetermined time intervals, and by revolving the pawl 34 upward or downward, if necessary, in accordance with a predetermined operation program.

For example, referring to FIG. 1, a rack 2 placed at the position A is charged automatically or manually with one or more bases, which have been coated with a resist in a predetermined pattern. The rack 2 is suspended from the first rail 31 through a holding member 32.

The bases charged in the rack 2 in the position A are introduced into the degreasing vessel 4a in such a manner that the first rail 31 from which the rack 2 is suspended by the holding member 32 moves up, so that the projection 323 of the holding member is joined with the pawl 34 extending downward from the second rail 33; the second rail 33 moves in the direction 3a, to move the pawl 34 from the position A to the position B, and stops when the pawl 34 reaches the position B; the first rail 31 moves down, release the pawl 34 from the projection 323 and to introduce the bases 1 into the degreasing vessel 4a while the second rail 33 moves in the opposite direction 3b; the bases are immersed in and treated with the degreasing liquid for a predetermined time, for example, one minute; the first rail 31 moves up, to withdraw the bases from the degreasing vessel 4a while the pawl 34 is revolved upward so that even when the projection 323 reaches an uppermost position thereof, the projection 323 is not joined with the pawl 34, and thus the second rail 33 can freely move in the direction 3a without transporting the holding member 32 and the rack 2; the first rail 31 moves down, to again immerse the bases in the degreasing vessel 4a, and stops when it reaches an lowermost position thereof to keep the bases in the degreasing liquid for a predetermined time, for example, one minute; and then the first rail 31 moves up to withdraw the bases from the degreasing vessel 4a.

When the first rail 31 reaches the uppermost position thereof at the position B, the pawl 34 is revolved downward so that the lower end portion of the pawl 34 is joined with the projection 323 of the holding member 32. The second rail 33 moves in the direction 3a, to convey the rack 2 from the position B to the position C which is just above the first water prewashing vessel 51. The bases 1 are introduced into the first water prewashing vessel 51, washed for a predetermined time, for example, one minute, and withdrawn from the vessel 51 in the same manner as mentioned above.

When the first rail 31 reaches the uppermost position thereof at the position C, the holding member 32 is joined with the joining means 33a of the second rail 33. The second rail 33 then moves in the direction 3a, to convey the rack 2 from the position C to the position D just above the second water pre-washing vessel 52. The bases 1 in the rack 2 are introduced into the vessel 52 and washed with streams of an ordinary washing water or deionized water ejected from the spray devices 56 and 57 for a predetermined time, for example two minutes, in the same manner as mentioned above. Then, the first rail 31 moves up to withdraw the bases 1 from the vessel 52 and to join the holding member 32 with the pawl 34 of the second rail 33. The second rail 33 moves in the direction 3a, to convey the rack 2 from the position D to the position E, and then the same procedures as mentioned above are carried out for washing the bases 1 with ionized water in the third water pre-washing vessel 53.

If the pawl 34 is revolved upward while the joining means 33a is in the position E, the second rail 33 can freely move in any direction without being joined with the first rail 31.

Next, the first rail 31 moves up, to withdraw the bases 1 from the third vessel 53, the projection 323 of the holding member 32 is joined with the pawl 34 at the position E, the second rail 33 moves in the direction 3a to convey the rack 2 from the position E to the position F, then the first rail 31 moves down to introduce the bases 1 into the electrodeposition coating vessel 6a.

Figure 5:
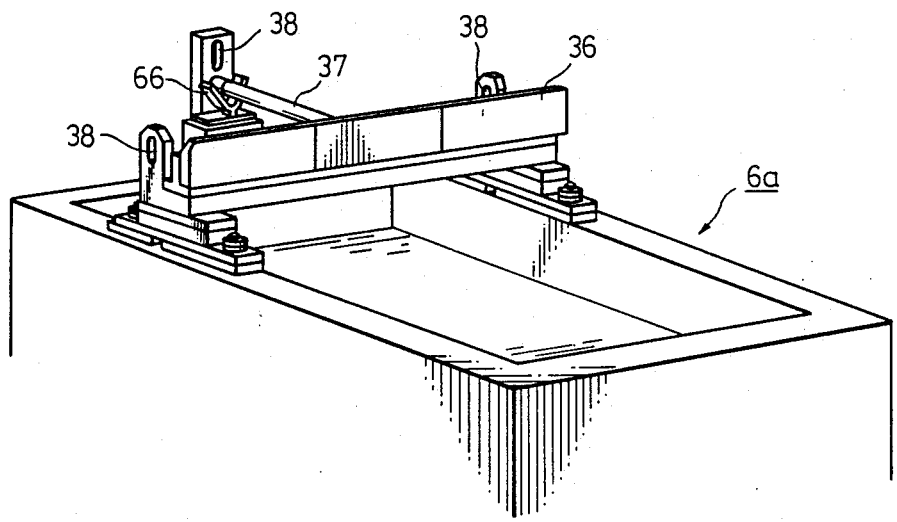
FIG. 5 is a schematic view of a separable electroconductive member of a transporting device.

Referring to FIGS. 2 and 5, a portion 36 of the first rail 31, which is located above the electrodeposition coating vessel 6a, is provided with an electricity-conducting bar 37. This portion 36 can be separated from the remaining portion of the first rail 31 when the first rail 31 reaches a lowermost position thereof. When the separable portion 36 is separated from the remaining portion of the first rail 31 at the lower most position thereof, the electricity-conducting bar 37, which extends from the separable portion 36 in a T-shape, comes into contact with a V-shaped electrode 66 which is insulated from the electrodeposition coating vessel 6a. The electricity-conducting bar 37 has a chuck (not shown in FIG. 5) located at an end portion of the bar 37 and the separable portion 36 also has chucks (not shown in FIG. 5) located at two end portions thereof. When the bar 37 is connected to the electrode 66, the chucks join with chuck holes 38, to support the separable portion 36 and the bar 37 at predetermined positions thereof.

When the first rail 31 moves down and the separable portion 36 is separated from the remaining portion of the first rail 31, it is connected to the electrode 66 through the bar 37. The remaining portion of the first rail 31 can move up and down independently from the separated separable portion 36.

Accordingly, the electrodeposition coating procedure for the bases can be carried out independently from the movement of the first and second rails 31 and 33, in accordance with a predetermined program.

For example, when the movement of the first rail 31 is programmed to move up at a time interval of one minute, the movement of the separated separable portion 36 can be programmed to move up only once every two times that the remaining portion of the first rail 31 is moved up. That is, connection of the separated separable portion 36 can be with the electrode 66 through the bar 37 can be maintained for two minutes.

While the separable portion 36 is connected to the electrode 66 through the bar 37, a certain amount of electric current is applied to the electrodeposition coating system through the separable portion 36, the holding member 32, the rack 2, and the base 1 (not shown in FIG. 5).

After the electrodeposition coating procedure applied to the bases 1 is completed, the chucks (not shown) are released from the chuck holes 38 and the separable portion 36 is joined with the remaining portion of the first rail 31. The first rail 31 is then moved up to withdraw the bases from the electrodeposition coating vessel 6a.

The electrodeposition coated bases 1 are conveyed from the position F to the position G and are washed with the filtrate in the first filtrate vessel 71, the washed bases 1 are conveyed from the position G to the position H and are further washed with the filtrate in the second filtrate vessel 72, and finally, the bases are conveyed from the position H to the position I, are post-washed with water in the water post-washing vessel 8a and are delivered from the apparatus, in the same manner as mentioned hereinbefore.

To enhance the effect of washing of the bases in the degreasing, water pre-washing, electrodepositing liquid-recovering, and water post washing vessels, the transporting device may be provided with means for shaking the first rail 31 up and down at a predetermined frequency and amplitude, to thus shake the bases 1 placed in the vessels. For example, a limit switch (not shown) may be attached to a driving mechanism (not shown) of the first rail 31 to shake the first rail 31 at a predetermined frequency and amplitude.

In the electrodeposition coating procedure, the separable portion 36 holding the rack in which a plurality of bases are held is separated from the first rail 31. Therefore, the bases 1 placed in the electrodeposition coating vessel 6a are not shaken by the first rail 31.

In an example of a program for operating the apparatus shown in FIG. 1, the separable portion 36 of the first rail 31 moves up once every two minutes, the remaining portion of the first rail 31 moves up once every one minute, and the second rail 33 makes one reciprocal movement every one minute.

Also, the pawl 4 in each of the positions A, B, D, F, and preferably E, revolve upward ensure that they are not joined with the holding member 32 at a frequency of once per two reciprocal movements of the second rail 33, i.e., every two minutes, by operating the air cylinder 35.

In the position A, the holding member 32 having the rack 2 in which a plurality of bases are placed, is joined with the joining means 33a of the second rail 33 and conveyed to the position B at a frequency of once per two minutes.

The bases can be treated in the degreasing vessel (position B) for two minutes, in the first water prewashing vessel 51 (position C) for one minute, in the second water pre-washing vessel 52 (position D) for two minutes, in the third water pre-washing vessel 53 (position E) preferably for two minutes, in the electrodeposition coating vessel 6a (position F) for two minutes, in the first filtrate vessel 71 (position G) for one minute, in the second filtrate vessel 71 (position H) for one minute, and finally, in the water post-washing vessel 8a for one minute.

In the degreasing vessel, the bases 1 are degreased by the degreasing liquid. Also, the bases in the rack are vibrated by the vibrating device and are shaken up and down by the first rail 31, to effectively remove bubbles formed on the surfaces of the bases. When the bases are to be used for throughhole printed circuit boards, bubbles in the throughholes must be effectively removed.

In the first water pre-washing vessel 51, the bases 1 are washed with washing water while being shaken by the first rail 31 to remove remaining degreasing liquid on the base surfaces.

In the second water pre-washing vessel 52, the bases 1 are washed with ordinary washing water streams ejected from the spray devices 56, and with deionized water streams ejected from the spray devices 57, while the bases 1 are shaken by the first rail 31, to remove the remaining degreasing liquid and a portion of ionic substances from the base surfaces.

In the third water pre-washing vessel 53, the bases 1 are washed with deionized water while the bases are shaken, to completely remove the remaining degreasing liquid and ionic substances from the base surfaces. Accordingly, the pre-washed bases 1 do not carry the degreasing liquid and ionic substances into the electrodeposition coating liquid, and therefore, the concentration and composition of the electrodeposition coating liquid are maintained at a constant level throughout the procedure, and thus an undesirable production of defective products is avoided.

In the electrodeposition coating vessel 6a, the remaining portions of the bases not coated with the resist are coated with an electrodeposition paint.

As described hereinbefore, when the first rail 31 moves down to the lowermost position thereof, the separable portion 36 is separated from the first rail 31 and is connected to the electrode 66 through the bar 37. Thus, the bases 1 are electrically connected to the electrode 66 through the rack 2, the holding member 32, the separable portion 36 of the first rail 31, and the bar 37.

In the first and second filtrate vessels 71 and 72, the electrodeposition coated bases 1 are effectively washed with the filtrate to remove non-fixed electrodeposition coating liquid remaining on the base surface, while the bases 1 are shaken by the first rail 31.

Finally, in the water post-washing vessel 8a, the coated bases 1 are post-washed with an ordinary washing water to completely remove remaining coating liquid on the bases 1, while the bases are shaken by the first rail 31.

Where each of the bases to be fed to the apparatus of the present invention comprises a substrate having an electroconductive metal surface layer and throughholes, the electroconductive metal surface layer and the inside peripheral surfaces of the holes being plated with a metal and both surfaces of the substrate being coated with a resist in a negative pattern corresponding to an aimed positive pattern, the bases processed by the apparatus of the present invention are taken out from the rack, are heat-treated to cure the electrodeposition coating layers, the resist coating layers on portions of the base surfaces are removed to provide exposed electroconductive metal layer portions of the base surfaces, the bases are etched to remove plating layers and electroconductive metal layers on the exposed portion of the base surfaces, and then the electrodeposition coating layers on the base surfaces are removed to provide throughhole printed circuit boards.

The apparatus of the present invention is useful not only for bases having insulating resist layers formed on both surfaces thereof in a predetermined pattern, but also for bases having one or two surfaces thereof entirely coated with electroconductive metal layers and having throughholes.

Figure 4B:
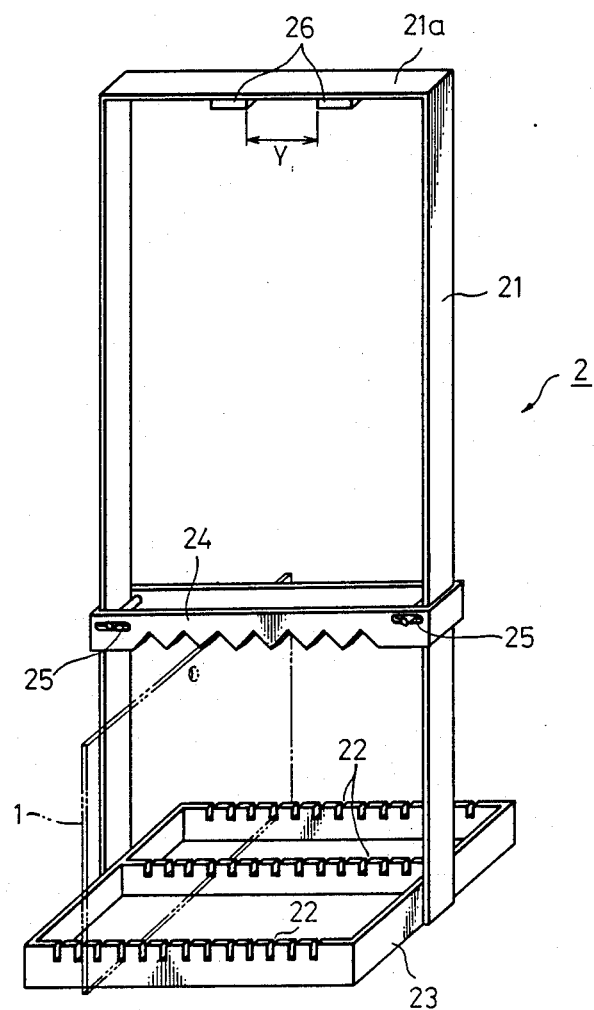
FIG. 4B is a schematic view of a rack for holding a plurality of bases.

Referring to FIG. 4B, the rack 2 comprises a vertical rectangular frame 21, a horizontal frame 23 fixed to the lower end of the vertical frame 21 and having a number of recesses 22, in which the bases are supported in such a manner that the bases are spaced from and arranged in parallel to each other, and an upper holding frame 24 which is capable of moving up and down along the vertical side plates of the vertical frame 21. The upper holding frame 24 has a number of recesses corresponding to the recesses 22 of the horizontal frame 23. When a number of bases 1 are held by the recesses 22 of the horizontal frame 23 and the upper holding frame 24, the upper holding flame 24 is fixed to the vertical plate of the vertical frame 21 by fastening thumbscrews 25.

The vertical frame 21 is provided with a pair of stoppers 26 located on a lower surface of an upper horizontal plate 21a thereof.

When the upper horizontal plate 21a of the vertical frame 21 is joined with the hooks 322 of the holding member 32 shown in FIG. 4A, the stoppers 26 prevent any horizontal movement of the upper horizontal plate 21a on the hooks 322. The distance X between the hooks 322 shown in FIG. 4A must be substantially equal to but not larger than the distance Y between the stoppers 26 shown in FIG. 4B.

Figure 6:
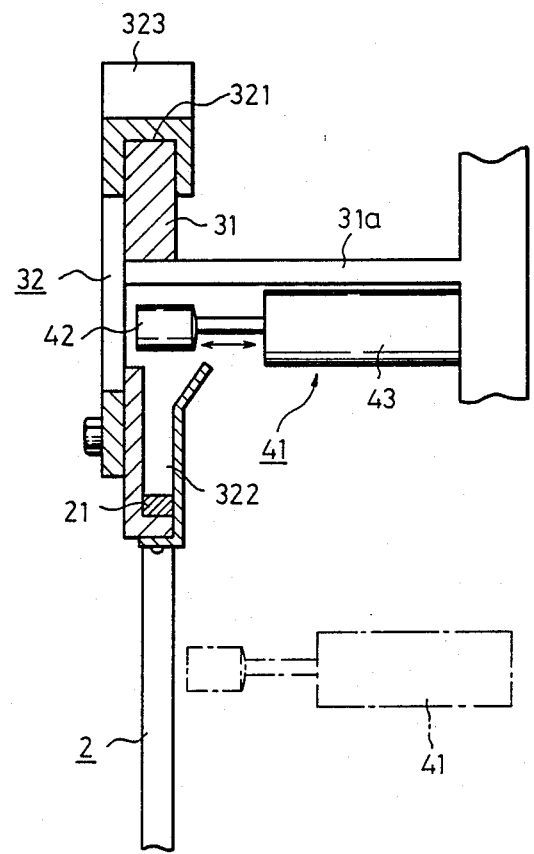
FIG. 6 is a partial cross-sectional view of a vibrating device for the bases.

FIG. 6 shows a vibrating device 41 for removing bubbles on the bases (not shown) in a degreasing vessel (not shown). That is, the vibrating device serves as a bubble-removing device for preventing a failure in the electrodeposition coating of the bases. Especially, where bases for throughhole printed circuit boards are produced, the vibrating device very effectively removes bubbles in the throughholes.

In FIG. 6, a frame 31a is fixed to a first rail 31, and a vibration-generating device 43 having a hammer 42 is fixed to the frame 31a in such a manner that the hammer 42 can impact on substantially a middle portion of a holding member 32.

When the vibration-generating device 43 is driven, the hammer 43 vibrates the holding member 32, and the thus generated vibration is transmitted to the bases through the rack 2.

The vibration generating device 43 may be an air cylinder type, an electromagnetic reciprocal movement type, or the like.

Also, the vibrating device 41 may be arranged in the position shown by a chain line in FIG. 6, so that the rack 2 can be directly vibrated by the hammer of the vibrating device 41.

Alternatively, the vibrating device is arranged so that the hammer impacts on a point of the holding member 32 slightly spaced from the central point of the holding member 32 in a horizontal direction. This vibration causes the rack 2 hanging from the holding member 32 to reversibly revolve around a vertical axis of the rack 2. This reversible revolution effectively enhances the removal of bubbles on the bases.

There is no limitation in the direction in which the hammer imparts the vibration to the holding member or the rack, but preferably, the vibration is generated in a direction normal to the faces of the bases.

Where the rack 2 shown in FIG. 4B is used, the bases 1 supported by the horizontal frame 23 and the upper holding frame 24 are preferably wound together with the frames 21, 23, and 24 with a rope, to avoid an undesirable dislodging of the bases 1 from the rack 2.

When the degreasing liquid contains a certain amount of a soft etching agent which can slightly etch the bases, the bubbles can be removed from the bases with an increased efficiency.

Figure 7:
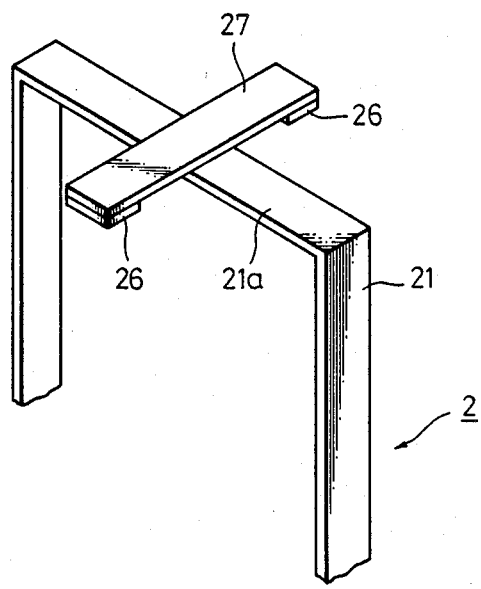
FIG. 7 is a schematic view of a portion of another rack.

FIG. 7 shows an upper portion of another type of rack. In FIG. 7, an additional horizontal plate 27 is fixed to an upper horizontal plate 21a of a vertical frame 21 of a rack 2 in such a manner that they cross at a right angle.

The additional horizontal plate 27 can be joined with hooks 322 of the holding member 32 as shown in FIG. 4A.

This type of rack holds the bases in a direction normal to that in which they are held in the rack shown in FIG. 4B. That is, the bases are held in parallel to the direction in which they are transported. When the rack is vibrated by the vibrating device as shown in FIG. 6, this type of rack: prevents an undesirable movement of the bases in the rack.

When the above-mentioned type of rack is used, the spray devices are preferably arranged so that the washing water is sprayed along the faces of the bases.

Figure 8:
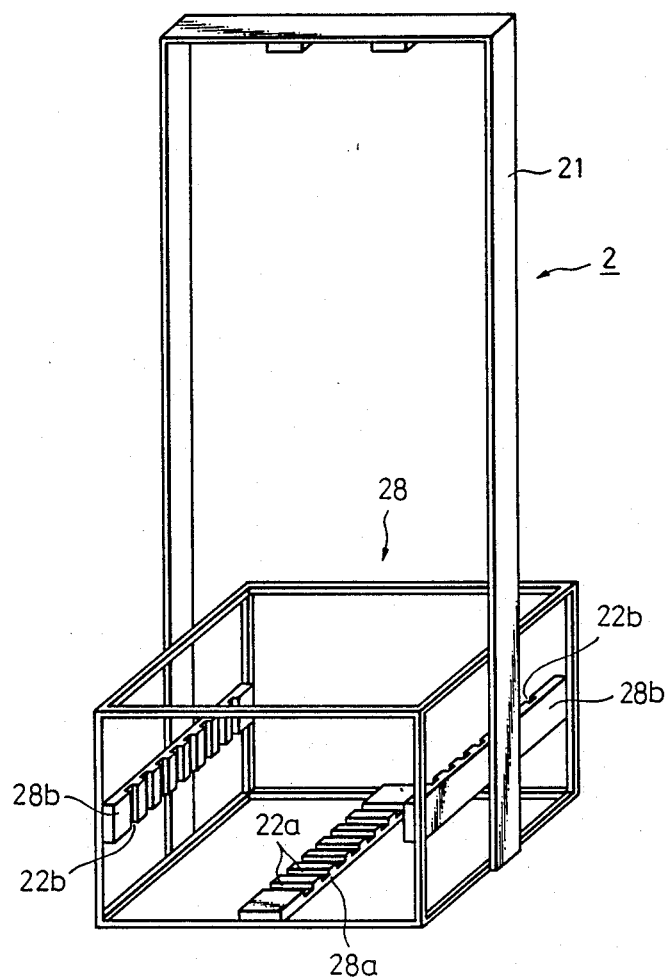
FIG. 8 is a schematic view of still another rack.

FIG. 8 schematically shows still another type of rack 2. This rack 2 has a box-shaped frame 28 located at the lower end of a vertical frame 21. The box-shaped frame 28 has a bottom plate 28a having a plurality of horizontal recesses 22a and two side plates 28b having a plurality of vertical recesses 22b. A plurality of bases (not shown) can be supported at a bottom point and two side points thereof by the horizontal and vertical recesses 22a and 22b. This box-shaped frame 28 can hold the bases without fear of a dislodging of same.

Figure 9:
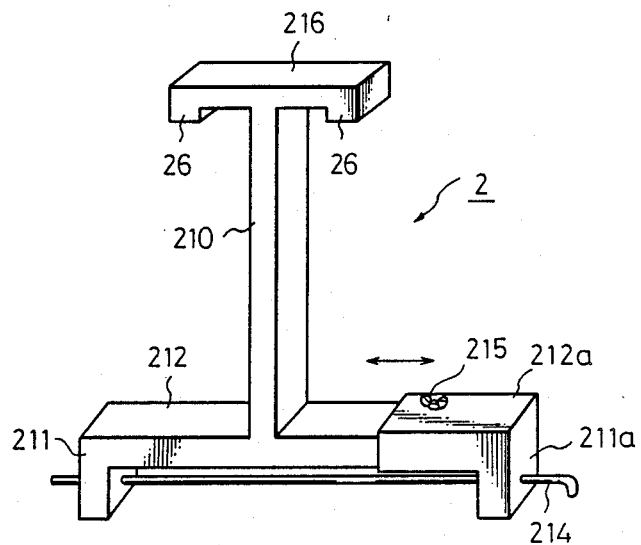
FIG. 9 is a schematic view of yet another rack.
Figure 10:
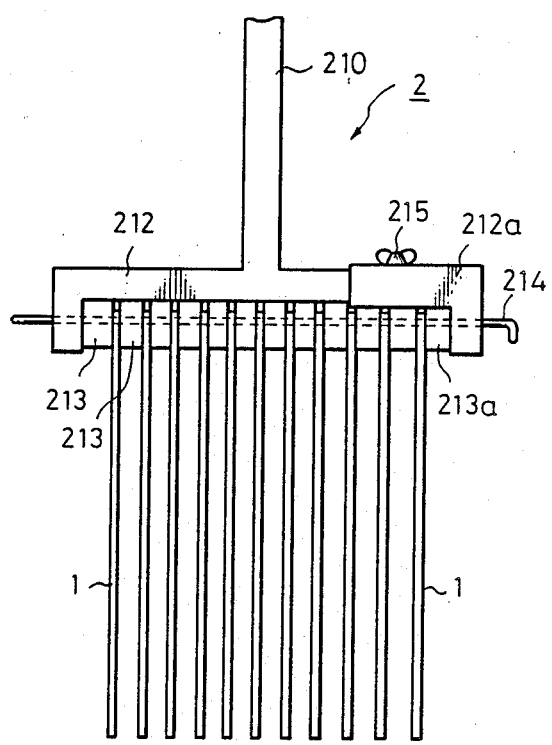
FIG. 10 shows a plurality of bases combined with the rack shown in FIG. 9.

FIGS. 9 and 10 show still another type of racks 2. This rack 2 comprises an upper horizontal member 216 having stoppers 26, a vertical member 210 extending downward from the upper member 216, a lower horizontal member 212 connected to the vertical member 210 and having a projection 211 extending downward from an end thereof, a sliding member 212a attached to the lower horizontal member 212 and having a projection 211a extending downward from an end thereof, a bore-holding pin 214 horizontally inserted through the projections 211 and 211a, and a thumbscrew 215 firmly fixing the sliding member 212a to the lower horizontal member 212. The sliding member 212a can move in two opposite directions, as shown by arrows in FIG. 9, to adjust the distance between the projections 211 and 211a to a desired value.

Referring to FIG. 10, the lower horizontal member 212 has a plurality of spacers 213 each extending downward from the lower surface thereof and having a hole for the holding pin 214. Also, the sliding member 212a has a plurality of spacers 213a each extending downward from the lower surface thereof and having a hole for the holding pin 214.

In FIG. 10, a plurality of bases 1 each having a hole located at an upper center portion thereof are inserted into gaps formed between the spacers 213 and between the spacers 213a. The base-holding pin 214 is inserted through the projection 213a, the holes of spacers 213a and 213 and the bases 1 and the projection 213 so that the bases 1 are suspended from the pin 214.

The rack 2 shown in FIGS. 9 and 10 has the following advantages:

1. A plurality of bases having different dimensions can be held at the same time.
2. Since the total outer surface area of the rack is relatively small, undesirable deposits on the surface can be easily removed.
3. The rack can firmly hold the bases without releasing same.
4. Since the rack is relatively small and light, the rack can be easily handled and water on the such can be easily removed.

Figure 11:
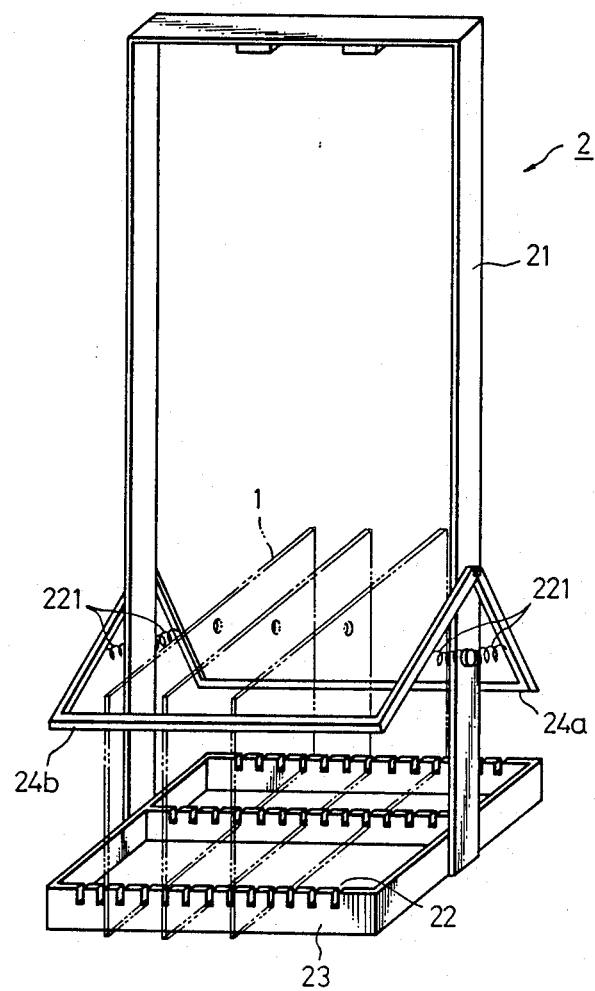
FIG. 11 is a schematic view of another rack.

In FIG. 11, a rack 2 has a lower horizontal frame 23 similar to that indicated in FIG. 4B and fixed to a lower end of the vertical frame 21 and a pair of upper frames 24a and 24b. Upper ends of the upper frames 24a and 24b are revolvably fixed to middle portions of the vertical frame 21.

The upper frames 24a and 24b are connected to each other by springs 221, to impart a force which will cause the upper frames 24a and 24b to revolve downward.

A plurality of bases 1 are placed in the lower frame 23 and are held by recesses 22, and the vertical side edges of the bases are pressed inward by the upper frames 24a and 24b, to firmly support the bases in the rack 2.

Figure 12:
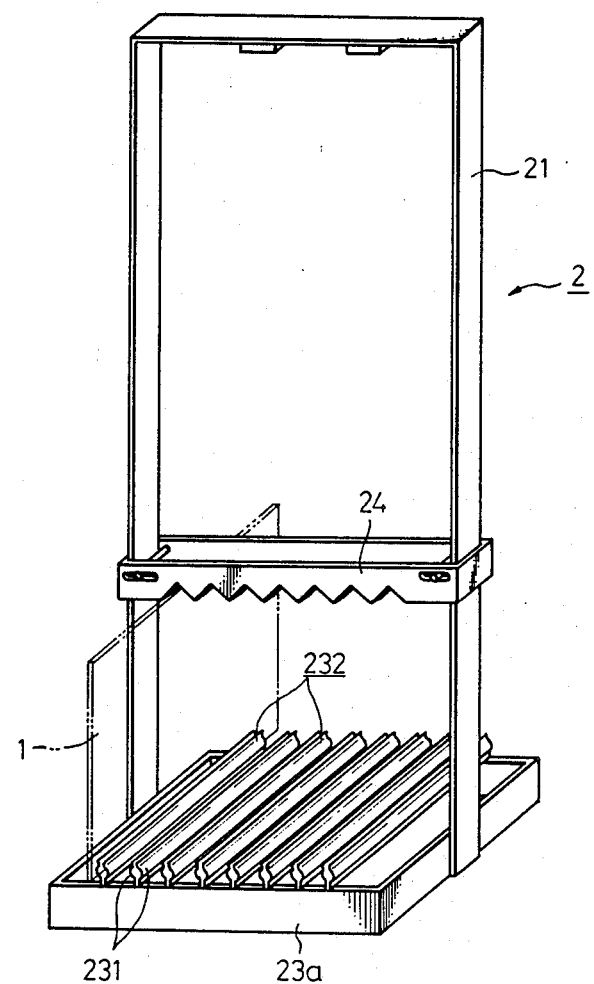
FIG. 12 is an schematic view of yet another rack.
Figure 13:
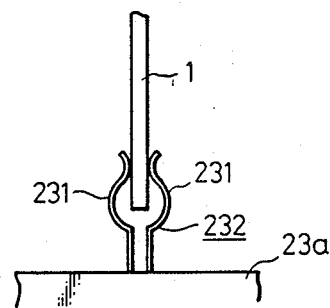
FIG. 13 shows a base combined with a portion of the rack shown in FIG. 12.

In FIGS. 12 and 13, the rack 2 comprises a vertical frame 21, an upper frame 24 similar to that shown in FIG. 4B, and a lower frame 23a having a plurality of clips 232 each consisting of a pair of opposing springy plates 231.

Lower portions of the bases 1 are vertically inserted in the clips 232 and upper portions of the bases 1 are held by recesses of the upper frame 24.

Figure 14:
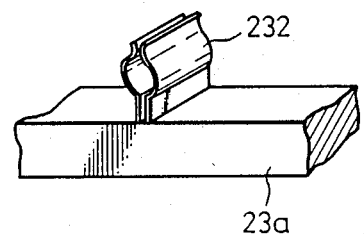
FIG. 14 is a schematic view of a modification of a gripper for a base shown in FIG. 12.

In FIG. 12, the clips 232 have a long body and extend across the lower frames 23a. The clips 232 may be shortened, as indicated in FIG. 14, and such short clips are preferably arranged at edge portions of the lower frame 23a, to evenly support the bases.

The elements of the apparatus of the present invention are preferably arranged as indicated in FIGS. 1 to 3, but may be arranged a manner other than that shown in FIGS. 1 to 3. Also, the racks as shown in FIGS. 4B and 7 to 14 are useful for the apparatus of the present invention, but may be of a type other than those mentioned above.

The transporting device disclosed in FIGS. 1 to 6 may be replaced by another type of device, so long as the bases can be intermittently conveyed, introduced into each vessel, kept in the vessel for a predetermined time and withdrawn from the vessel thereby in accordance with a predetermined program.

The water pre-washing zone may comprise a single washing vessel or two washing vessels, but preferably has at least one vessel in which the bases can be washed with deionized water.

The electrodeposition coating zone may comprise a single filtrate vessel or three or more filtrate vessels.

The rack may be directly joined to the first rails 31 without using the holding member as disclosed in FIG. 4A.

I claim:

1. An apparatus for continuously producing a base for a printed circuit board comprising:
   (A) a degreasing zone for degreasing at least one base for a printed circuit board, comprising at least one vessel containing a degreasing liquid;

(B) a water pre-washing zone for pre-washing said degreased base with water, comprising at least one water pre-washing vessel located downstream from the degreasing zone;

(C) an electrodeposition coating zone for treating said pre-washed base with an electrodepositing liquid, comprising at least one vessel containing the electrodepositing liquid and located downstream from the water pre-washing zone;

(D) a zone for recovering electrodepositing liquid remaining on said electrodeposition coated base, comprising at least one filtrate vessel connected to an ultrafiltration device and to the electrodeposition coating zone to form a closed channel and located downstream from the electrodeposition coating zone;

(E) a water post-washing zone for washing said base delivered from the recovering zone, comprising at least one water post-washing vessel located downstream from the recovering zone; and (F) a transporting device for intermittently transporting said base successively through the degreasing, water pre-washing, electrodeposition coating, filtrate and water post-washing vessels, which transporting device is provided with means for conveying said base to a predetermined position above one of said vessels, stopping said base at said predetermined position, introducing said base into said one of said vessels, keeping said base in said vessel for a predetermined time and withdrawing said base from said vessel.

2. The apparatus as claimed in claim 1, wherein a vibrating device for vibrating the bases thereof is arranged above at least one degreasing vessel in the degreasing zone.

3. The apparatus as claimed in claim 1, wherein the water pre-washing zone comprises at least one first water pre-washing vessel containing therein an ordinary washing water, at least one second water pre-washing vessel located downstream from the first vessel and provided with a spray device for spraying one of an ordinary washing water and a deionized water toward the bases therein, and at least one third water pre-washing vessel containing therein deionized water and located downstream from the second vessel.

4. The apparatus as claimed in claim 3, wherein a vibrating device for vibrating the bases therein is arranged above at least one of the first, second and third pre-water washing vessels.

5. The apparatus as claimed in claim 3, wherein the third water pre-washing vessel is provided with an ion-exchange device for continuously supplying deionized water to the vessel and with means for continuously discharging waste washing water from the vessel.

6. The apparatus as claimed in claim 3, wherein the third water pre-washing vessel is provided with an ion-exchange device for continuously supplying deionized water to the vessel and with means for continuously circulating waste washing water to the ion-exchange device.

7. The apparatus as claimed in claim 1, wherein the electrodeposition coating vessel is provided with means for controlling the temperature of the electrodepositing liquid therein to a predetermined level.

8. The apparatus as claimed in claim 7, wherein the temperature-controlling means of the electrodeposition coating vessel comprises at least one jacket formed in at least a portion of the peripheral wall and the bottom of the vessel and connected to a water supply source, and a heater located in the jacket, for heating the water in the jacket.

9. The apparatus as claimed in claim 1, wherein the electrodeposition coating vessel is provided with an insulating net covering the inside peripheral and bottom surfaces of the vessel, to prevent a direct contact of the base with the inside surface of the vessel.

10. The apparatus as claimed in claim 1, wherein the electrodeposition coating zone further comprises at least one overflow vessel each connected to one of the electrodeposition coating vessels, to receive an overflow of the electrodepositing liquid from the electrodeposition coating vessel, and a pump located between the electrodeposition coating vessel and the overflow vessel, to circulate a portion of the electrodepositing liquid from the overflow vessel to the electrodeposition coating vessel.

11. The apparatus as claimed in claim 1, wherein the water-washing vessel in the water post-washing zone contains ordinary washing water.

12. The apparatus as claimed in claim 1, wherein at least one water-washing vessel in the water post-washing zone is provided with a spray device located above the vessel and connected to an ordinary washing water-supply source to spray the ordinary washing water onto bases positioned above the vessel.

13. The apparatus as claimed in claim 1, wherein the water post-washing zone comprises two or more water washing vessels.

14. The apparatus as claimed in claim 1, wherein the transporting device is provided with a plurality of racks each capable of holding a base, spaced from each other, and capable of being connected to an electric current source.

15. The apparatus as claimed in claim 14, wherein each base is held in a rack in such a manner that the surface of the base is in parallel to the direction along which the base is conveyed.

16. The apparatus as claimed in claim 14, wherein the transporting device is provided with means joined to the racks for vertically moving the rack up and down and means for horizontally moving the rack in two opposite directions.

17. The apparatus as claimed in claim 16, wherein the vertical moving means has a portion thereof separable from the remaining portion thereof and located above the electrodeposition coating vessel, and the separable portion is connected to an electrode when the rack having the separable portion joined thereto is introduced into the electrodeposition coating vessel.

18. The apparatus as claimed in claim 16, wherein the vertical moving means is provided with means for shaking the vertical moving means up and down when the vertical moving means is in a lowermost position.

19. An apparatus for continuously producing a base for a printed circuit board comprising:

(A) a degreasing zone for degreasing at least one base for a printed circuit board, comprising at least one vessel containing a degreasing liquid;

(B) a water pre-washing zone for pre-washing said degreasing base with water, comprising at least one water pre-washing vessel located downstream from the degreasing zone;

(C) an electrodeposition coating zone for treating said pre-washed base with an electrodepositing liquid, comprising at least one vessel containing the electrodepositing liquid and located downstream from the water pre-washing zone, and at least one overflow vessel, each connected to the electrodepositing liquid-recovering zone, which comprises a first filtrate vessel located downstream from the electrodeposition coating zone, and a second filtrate vessel located downstream from the first filtrate vessel and connected to the electrodeposition coating zone through a pump and an ultrafiltration device, to withdraw a portion of the electrodepositing liquid from the overflow vessel, to filter the withdrawn portion to obtain a filtrate and a filtered electrodeposition coating material, and then to circulate the filtrate into the overflow vessel through the second filtrate vessel and the first filtrate vessel;

(D) a zone for recovering electrodepositing liquid remaining on said electrodeposition coated base, comprising at least one filtrate vessel connected to an ultrafiltration device and to the electrodeposition coating zone to form a closed channel and located downstream from the electrodeposition coating zone;

(E) a water post-washing zone for washing said base delivered from the recovering zone, comprising at least one water post-washing vessel located downstream from the recovering zone; and (F) a transporting device for intermittently transporting said base successively through the degreasing, water pre-washing, electrodeposition coating, filtrate and water post-washing vessels, which transporting device is provided with means for conveying said base to a predetermined position above one of said vessels, stopping said base at said predetermined position, introducing said base into said one of said vessels, keeping said base in said vessel for a predetermined time and withdrawing said base from said vessel.

20. The apparatus as claimed in claim 19, wherein the filtered electrodeposition coating material is returned from the ultrafiltration device to the overflow vessel through a flow line.

21. The apparatus as claimed in claim 19, wherein the overflow vessel is further connected to a spray device located above the electrodeposition coating vessel through a pump and an ultrafiltration device, to withdraw a portion of the electrodepositing liquid from the overflow vessel, filter the withdrawn portion of the waste electrodepositing liquid, circulate the filtrate to the spraying device, and then spray the filtrate toward the bases positioned above the electrodeposition coating vessel.

22. The apparatus as claimed in claim 19, wherein a spray device is arranged above at least one of the first and second filtrate vessels and connected to the filtrate vessel through a pump to withdraw a portion of the filtrate from the vessel and spray the withdrawn portion of the filtrate toward the bases positioned above the vessel.

* * * * *